US011283436B2

(12) United States Patent
van der Wagt et al.

(10) Patent No.: US 11,283,436 B2
(45) Date of Patent: Mar. 22, 2022

(54) PARALLEL PATH DELAY LINE (71) Applicant: Teradyne, Inc., North Reading, MA (US)

(72) Inventors: Jan Paul Anthonie van der Wagt, Carlsbad, CA (US); Denis Zelenin, Los Angeles, CA (US)

(73) Assignee: Teradyne, Inc., North Reading, MA (US)

( * ) Notice: Subject to any disclaimer, the term of this patent is extended or adjusted under 35 U.S.C. 154(b) by 62 days.

(21) Appl. No.: 16/395,082

(22) Filed: Apr. 25, 2019

(65) Prior Publication Data

US 2020/0343882 A1 Oct. 29, 2020

(51) Int. Cl.
*H03K 5/15* (2006.01)
*G01R 35/00* (2006.01)
*G01R 31/28* (2006.01)
*H03K 5/00* (2006.01)
*H03K 19/21* (2006.01)

(52) U.S. Cl.
CPC ..... *H03K 5/15006* (2013.01); *G01R 31/2834* (2013.01); *G01R 35/005* (2013.01); *H03K 19/21* (2013.01); *H03K 2005/00019* (2013.01)

(58) Field of Classification Search
CPC ............... H03K 5/15006; H03K 19/21; H03K 2005/00019; G01R 31/2834; G01R 35/005
See application file for complete search history.

(56) References Cited

U.S. PATENT DOCUMENTS 4,777,452 A 10/1988 Hayami et al.
5,155,451 A 10/1992 Gladden et al.
(Continued)

FOREIGN PATENT DOCUMENTS

JP 5715525 B2 5/2015
KR 10-0601309 B1 7/2006
(Continued)

OTHER PUBLICATIONS

U.S. Appl. No. 16/395,098, van der Wagt et al., filed Apr. 25, 2019.
(Continued)

*Primary Examiner* — Akm Zakaria
(74) *Attorney, Agent, or Firm* — Wolf, Greenfield & Sacks, P.C.

(57) ABSTRACT

Circuitry and methods of operating the same to delay a signal by a precise and variable amount. One embodiment is directed to a high speed delay line used in automated test equipment. The inventors have recognized and appreciated that an input signal having high data rate may be split into parallel split signals having lower data rates that are delayed in respective parallel delay paths before being combined to generate a delayed signal. One advantage of delaying a signal in such a fashion is to provide high delay line timing accuracy at high data speeds, while using a compact circuit design using circuitry components of lower bandwidth with reduced power consumption, for example by using complementary metal-oxide-semiconductor (CMOS). A further advantage is that a high speed delay line may be constructed from multiple lower data rate parallel delay lines that are modular, simplifying circuit design.

17 Claims, 7 Drawing Sheets

(56) References Cited

U.S. PATENT DOCUMENTS

| | | | |
|---|---|---|---|
| 5,345,599 A * | 9/1994 | Paulraj | H04B 7/0848 342/367 |
| 5,430,337 A | 7/1995 | Castello et al. | |
| 5,436,581 A | 7/1995 | Oberhauser | |
| 5,977,818 A | 11/1999 | Czarnul et al. | |
| 6,166,569 A | 12/2000 | McQuilkin | |
| 6,246,269 B1 | 6/2001 | Schuler et al. | |
| 6,252,441 B1 | 6/2001 | Lee et al. | |
| 6,526,113 B1 * | 2/2003 | Gutierrez | H03L 7/089 327/156 |
| 6,859,075 B1 | 2/2005 | van der Wagt et al. | |
| 7,187,742 B1 | 3/2007 | Logue et al. | |
| 7,671,630 B2 | 3/2010 | Howe et al. | |
| 8,446,169 B1 | 5/2013 | Marlett et al. | |
| 8,446,173 B1 | 5/2013 | Faucher et al. | |
| 8,760,188 B2 | 6/2014 | Gondi et al. | |
| 8,779,819 B1 | 7/2014 | Venditti | |
| 8,854,108 B1 | 10/2014 | Suzuki | |
| 9,147,620 B2 | 9/2015 | van der Wagt et al. | |
| 9,231,631 B1 | 1/2016 | Ke et al. | |
| 9,281,969 B2 | 3/2016 | Gondi et al. | |
| 9,397,670 B2 | 7/2016 | van der Wagt et al. | |
| 9,503,065 B1 | 11/2016 | van der Wagt et al. | |
| 9,805,822 B1 * | 10/2017 | Aleksandrowicz | G11C 29/023 |
| 9,887,710 B1 | 2/2018 | Lim et al. | |
| 10,048,717 B1 | 8/2018 | Chen | |
| 10,491,436 B1 | 11/2019 | Lim et al. | |
| 10,554,450 B2 | 2/2020 | Elzeftawi et al. | |
| 10,761,130 B1 | 9/2020 | van der Wagt et al. | |
| 10,942,220 B2 | 3/2021 | van der Wagt et al. | |
| 2004/0095701 A1 | 5/2004 | Ingino, Jr. | |
| 2004/0263204 A1 | 12/2004 | Chandler et al. | |
| 2005/0193356 A1 | 9/2005 | Kuekes et al. | |
| 2006/0010360 A1 | 1/2006 | Kojima | |
| 2006/0238175 A1 | 10/2006 | Cho et al. | |
| 2006/0244479 A1 | 11/2006 | Major | |
| 2006/0256908 A1 | 11/2006 | Ludwig | |
| 2006/0273832 A1 | 12/2006 | Matsumoto | |
| 2007/0126410 A1 * | 6/2007 | Figoli | H02M 3/1588 323/283 |
| 2007/0229139 A1 | 10/2007 | Lin | |
| 2008/0284466 A1 | 11/2008 | Cranford, Jr. et al. | |
| 2009/0196313 A1 * | 8/2009 | Ridel | H04L 5/023 370/536 |
| 2010/0299644 A1 | 11/2010 | Kawai | |
| 2011/0309865 A1 | 12/2011 | Cordos | |
| 2012/0086423 A1 | 4/2012 | Dao et al. | |
| 2012/0158348 A1 | 6/2012 | Watanabe et al. | |
| 2013/0027010 A1 | 1/2013 | Groeneweg et al. | |
| 2013/0342254 A1 * | 12/2013 | Mazumder | H03H 11/26 327/276 |
| 2014/0035549 A1 | 2/2014 | Hafizi et al. | |
| 2014/0312865 A1 | 10/2014 | Dobkin et al. | |
| 2016/0065183 A1 | 3/2016 | Antonie van der Wagt | |
| 2016/0112223 A1 | 4/2016 | Kitsukawa et al. | |
| 2016/0173090 A1 | 6/2016 | Meinerzhagen et al. | |
| 2016/0182080 A1 | 6/2016 | Vasani et al. | |
| 2016/0227004 A1 | 8/2016 | Conner | |
| 2017/0155317 A1 | 6/2017 | Wang | |
| 2018/0329440 A1 | 11/2018 | Jefremow et al. | |
| 2019/0074838 A1 * | 3/2019 | Kitagawa | H03K 19/018521 |
| 2020/0341059 A1 | 10/2020 | van der Wagt et al. | |

FOREIGN PATENT DOCUMENTS

| | | |
|---|---|---|
| KR | 10-0605498 B1 | 7/2006 |
| KR | 10-0618828 B1 | 8/2006 |
| KR | 10-0798835 B1 | 1/2008 |

OTHER PUBLICATIONS

U.S. Appl. No. 16/395,104, van der Wagt et al., filed Apr. 25, 2019.
U.S. Appl. No. 16/395,120, van der Wagt et al., filed Apr. 25, 2019.
[No Author Listed], LVDS Owner's Manual. Texas Instruments. 4th Edition. 2008. 111 pages, http://www.ti.com/interface/lvds-m-lvds-pecl/technical-documents.html [last accessed: Jul. 17, 2019].
Branson, Integrated Tester Pin Electronics. IEEE Design & Test of Computers. 1990;7:4-14.
Cherry et al., The design of wide-band transistor feedback amplifiers. Proceedings of the Institution of Electrical Engineers. 1963;110(2):375-389. DOI: 10.1049/piee.1963.0050.
Dettloff et al., A 32mW 7.4Gb/s Protocol-Agile Source-Series-Terminated Transmitter in 45nm CMOS SOI. IEEE International Solid-State Circuits Conference Digest of Technical Papers. Feb. 10, 2010. p. 370-371. DOI: 10.1109/ISSCC.2010.5433825.
Enz et al., Charge-Based MOS Transistor Modeling. John Wiley & Sons. 2006. Section 4.4.4. p. 41-42. ISBN: 047085541X.
Ershov et al., EDA software for verification of metal interconnects in ESD protection networks at chip, block, and cell level. 35th Electrical Overstress/Electrostatic Discharge Symposium. Sep. 2013. p. 1-7.
Esch et al., Near-Linear CMOS I/O Driver With Less Sensitivity to Process, Voltage, and Temperature Variations. IEEE Transactions on VLSI Systems. 2004;12(11):1253-7. DOI: 10.1109/TVLSI.2004. 836321.
Greshishchev et al., A 60-dB Gain, 55-dB Dynamic Range, 10-Gb/s Broad-Band SiGe HBT Limiting Amplifier. IEEE Journal of Solid-State Circuits. 1999;34(12):1914-20. DOI: 10.1109/4.808916.
Hatamkhani et al., A 10mW 3.6Gbps I/O Transmitter. Symposium on VLSI Circuits. Jun. 2003. p. 97-98. DOI: 10.1109/VLSIC.2003. 1221172.
Knight et al., A Self-Terminating Low-Voltage Swing CMOS Output Driver. IEEE Journal of Solid-State Circuits. 1988;23(2):457-64. DOI: 10.1109/4.1007.
Kojima et al., 8Gbps CMOS Pin Electronics Hardware Macro with Simultaneous Bi-directional Capability. IEEE International Test Conference. Nov. 2012. p. 1-9. DOI: 10.1109/TEST.2012.6401543.
Kossel et al., A T-Coil-Enhanced 8.5 Gb/s High-Swing SST Transmitter in 65 nm Bulk CMOS With < -16 dB Return Loss Over 10 GHz Bandwidth. IEEE Journal Solid-State Circuits. 2008;43(12):2905-2920. DOI: 10.1109/JSSC.2008.2006230.
Laskin, On-Chip Self-Test Circuit Blocks for High-Speed Applications. Thesis submitted for MS of Applied Science Graduate Department of Electrical and Computer Engineering. University of Toronto. 2006. Chapter 2.3. p. 13-16.
Nauta et al., Analog Line Driver with Adaptive Impedance Matching. IEEE Journal of Solid-State Circuits. 1998;33(12):1992-8. DOI: 10.1109/4.735540.
O'Reilly, Series-Parallel Generation of m-Sequences. Radio and Electronic Engineer. 1975;45(4):171-6. DOI: 10.1049/ree.1975. 0033.
Sayag et al., Compact Modeling and Comparative Analysis of Silicon-Chip Slow-Wave Transmission lines With Slotted Bottom Metal Ground planes. IEEE Transaction on Microwave Theory and Techniques. 2009;57(4):840-7. DOI: 10.1109/TMTT.2009. 2015041.
Schneider et al., CMOS Analog Design Using All-Region MOSFET Modeling. Cambridge University Press. 2010. Section 1.2.3. p. 7-14. ISBN: 052111036X.
Tanzawa et al., High-Voltage Transistor Scaling Circuit Techniques for High-Density Negative-Gate Channel-Erasing NOR Flash Memories. IEEE Journal of Solid-State Circuits. 2002;37(10):1318-25. DOI: 10.1109/JSSC.2002.803045.
Tsividis, Operation and Modeling of the MOS Transistor. Oxford University Press. 2nd Edition. 1999. Section 4.5.2. p. 156-158. ISBN: 0195170146.
Van Der Wagt et al., 50Gb/s 3.3V Logic ICs in InP-HBT Technology. Symposium on VLSI Circuits Digest of Technical Papers. Jun. 2004. p. 326-329. DOI: 10.1109/VLSIC.2004.1346604.
Wallinga et al., Design and Analysis of CMOS Analog Signal Processing Circuits by Means of a Graphical MOST Model. IEEE J. Solid-St. Circuits. 1989;24(3):672-80. DOI: 10.1109/4.32024.
Zheng et al., Capacitive Floating Level Shifter: Modeling and Design. IEEE Region 10 Conference. Nov. 2015. 6 pages. DOI: 10.1109/TENCON.2015.7373013.

(56) References Cited

OTHER PUBLICATIONS

International Search Report and Writen Opinion for International Application No. PCT/US2020/029484, dated Aug. 11, 2020.
International Search Report and Writen Opinion for International Application No. PCT/US2020/029490, dated Aug. 11, 2020.
International Search Report and Writen Opinion for International Application No. PCT/US2020/029499, dated Aug. 5, 2020.
Van Der Wagt et al., Voltage Driver Circuit, U.S. Appl. No. 16/395,098, filed Apr. 25, 2019.
Van Der Wagt et al., Voltage Driver With Supply Current Stabilization, U.S. Appl. No. 16/395,104, filed Apr. 25, 2019.
Van Der Wagt et al., Voltage Driver Circuit Calibration, U.S. Appl. No. 16/395,120, filed Apr. 25, 2019.

* cited by examiner

PARALLEL PATH DELAY LINE

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate or measure a pattern of digital signals to enable testing of digital logic within a semiconductor device. Digital signals have timings that are represented by the position of data edges, such as rising edges or falling edges, in the time domain within the digital signals.

An ATE is frequently used to apply a test signal with a specific timing, or in some instances, to apply multiple test signals with coordinated timings to one or more test points of the DUT. To coordinate the timing, an ATE may be designed to synchronize the generation of the multiple test signals within different channels. Though, merely synchronizing the times at which test signals are generated may not be adequate to coordinate the time of arrival of the signals at test points of the DUT. Differences in propagation delays through instruments within the ATE can change relative timings of test signals, thereby affecting the accuracy of test results. To increase testing accuracy, one or more delay lines may be employed in the ATE to provide adjustable propagation delays. An ATE may be calibrated by adjusting relative propagation delays through the delay lines. Such calibration may be done at various times, including when an ATE is manufactured, is installed, on a periodic schedule or at times depending on an amount of use.

SUMMARY

Aspects of the present application are directed to an apparatus and methods of operating the same to delay the timing of a signal.

According to some embodiments, an apparatus for delaying a signal is provided. The apparatus comprises a splitter circuit having an input and N outputs (N is at least two). The splitter circuit is configured to receive an input signal having a first data rate at the input, and to generate N split signals at the respective outputs, each of the N split signals has a data rate that is less than the first data rate. The apparatus further comprises a delay circuit configured to generate a delayed signal based on the N split signals. The delayed signal is the input signal with a delay.

According to some embodiments, a method for delaying a signal is provided. The method comprises receiving, with a splitter circuit, an input signal having a plurality of rising and falling edges at a first data rate; generating, with the splitter circuit, a first split signal having a plurality of rising and falling edges at a second data rate, and a second split signals having a plurality of rising and falling edges at a third data rate, wherein the second and third data rates are less than the first data rate; generating, at a delay circuit, a delayed signal based on the first and second split signals. The delayed signal is the input signal with a delay.

According to some embodiments, a method for calibrating a test equipment is provided. The test equipment comprises a splitter circuit configured to receive an input signal having a first data rate, and to generate a first and a second split signals each having a data rate that is less than the first data rate; a first delay path configured to delay the first split signal by a first amount; a second delay path configured to delay the second split signal by a second amount; and a combiner circuit configured to receive the delayed first and second split signals at a first input and a second input, respectively, and to generate a delayed signal at an output based on the delayed first and second split signals. The method comprises measuring the delayed signal at an output of the combiner circuit; and calibrating the first amount and the second amount based on the measured delayed signal.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

The inventors have recognized and appreciated techniques and circuit designs for efficiently producing high speed signals with high timing accuracy, yet low power consumption. Such techniques may entail splitting an input signal having high data rate into parallel split signals having lower data rates. The split signals may be delayed in respective parallel delay paths before being combined to generate a delayed signal that is the input signal with a delay.

Techniques as described herein may be used to generate timing signals in ATE. Each of multiple signal paths may include a delay circuit and the amount of delay introduced by each such delay circuit may be variable. The amount of delay for each delay circuit may be determined based on a desired use of the delayed signal, and may be programmed as part of the programming of the test system, then offset by a calibration value determined during a calibration process such that the amount of delay may calibrate for variations in delay among the signal paths.

Delaying a signal in this fashion may provide high timing accuracy at high data speeds using a compact and modular circuit design. In some embodiments, a high speed delay line may be constructed from multiple lower data rate parallel delay lines that are each modular, simplifying circuit design of the high speed circuit. In one embodiment, a delay line according to aspects of the present application may operate on signals having data speed of at least 10 Gbps. Such a high speed delay line may be implemented with components of bandwidth slower than 10 Gbps, for example with half-rate (5 Gbps) bandwidth components. In one example, the half-rate components may be constructed in a compact design using a few tens of complementary metal-oxide-semiconductor (CMOS) transistors.

A variable delay line of this type may be used, for example, in the pin electronics (PE) of an ATE. Within an ATE, a digital test instrument may be implemented with pin electronics (PE), a timing generator (TG) that incorporate multiple variable delay lines to delay digital data in small time increments. The TG takes in vector data and period information from a pattern generator (PG), and produces timed signals that control the PE by generating receive strobe and drive path edge times. The PE, PG and TG may be separate components, or may be implemented as one or more integrated circuits (ICs) that comprise a large number of transistors. The variable delay for each delay line may be based on the use of the signal output from the delay line. For example, if the delay line output is coupled to a control input of a driver such that the delay line output sets the time of drive path edge, the variable delay may be set to result in a signal that controls the driver to output an edge at a desired time. The amount of delay to produce such a signal may be based on a programmed value for that edge offset by a calibration value that may be determined for signal path, including the delay circuit and the driver and other components that may impact the time at which such an edge is generated.

The inventors have recognized and appreciated that when test signals in the PE have high data rates on the order of multiple Gbps, such as up to 10 Gbps, a delay line that can provide accurate data edge placement with a resolution in the single picosecond range can be achieved using a low cost and low power technology, such as CMOS.

Aspects of the present application are directed to a delay line architecture in which an input signal having a high data rate may be split in a splitter circuit into parallel split signals having lower data rates that are delayed in respective parallel delay paths. Because each of the split signals has a lower rate of data (rising/falling) edges and in general greater timing separation between adjacent data edges compared to the input signal, the parallel delay paths may be implemented using circuitry components of lower bandwidth than the data rate of the input signal, for example using CMOS transistors based on 65 nm or 40 nm node technology. The inventors have recognized and appreciated that using lower bandwidth CMOS components operating at lower data rate reduces overall electrical power consumption of the delay line compared to using a single high data rate delay line, among other benefits. This is true even though the number of components may be larger. The lower bandwidth components may be part of a delay circuit of the parallel delay line architecture.

The delay circuit is configured to apply selective amounts of delays using multiple parallel delay paths to each of the split signals, and to combine the delayed split signals in a combiner to generate the delayed signal that is substantially the same as the input signal with a delay based on the parallel split signals. The amount of delay may be programmable by using variable delay components in each of the parallel delay paths.

In some embodiments, an input signal with a high data rate is split into two signals each having substantially half the data rate of the input signal. For such a signal, and assuming input signal edges can be present only at positions defined by a periodic clock, the minimum data edge separation is twice the minimum data edge separation of the input signal. The average data rate of such a signal will converge to half the data rate for of the input signal for a sufficiently long random input signal. However, the splitter circuit may be implemented with simple circuit components and the instantaneous data rate of each split signal may vary over time based on the pattern of rising and falling edges in the input signal.

Delay circuits having low bandwidth components may be used to delay the two split signals, which, when recombined into a full rate signal, yields a delayed version of the input signal. Such a delayed signal may be produced with reduced electric power consumption of the delay line relative to delay lines implemented in semiconductor technology that delay the full rate signal, while providing accurate amount of delay.

A circuit that splits an input signal into two, substantially half rate signals is described herein for purposes of illustrating the circuit designs for a delay line. It should be appreciated, however, that delay lines may be implemented with a circuit that splits an input signal into N parallel paths, each of which is delayed before being recombined into a delayed version of the input. As an example, a two-fold splitting and combining may be repeated twice in a hierarchical fashion, resulting in four parallel paths. As another example, compact non-hierarchical circuits for splitting into more than two signals and combining them may be used and these are natural generalizations of the exemplary design described below that will be recognized by those skilled in the art.

Any suitable methods may be used to split an input signal into two lower-rate split signals. According to an aspect, a split circuit may be used to receive the input signal at an input and generate first and second split signals at two outputs. In some embodiments, each of the first and second split signals comprises, on average, half the amount of data edges in a given time period compared to the input signal and thus has substantially half the data rate of the input signal.

Because the input signal typically comprises a stream of consecutive and alternating rising and falling edges, the inventor has recognized and appreciated that one way to split the input signal into two half-rate split signals is to alternatively generate rising/falling edges in the two split signals for every rising/falling edge received from the input signal. In one exemplary embodiment, the splitter circuit is configured to generate a first edge in a first split signal but not in a second split signal in response to receiving a rising edge in the input signal, and to generate a second edge in the second split signal but not in the first split signal in response to receiving a falling edge subsequent to the rising edge in the input signal. In effect, each of the data edges in the first split signal corresponds to rising edges of the input signal, while each of the data edges in the second split signal corresponds to falling edges of the input signal. Without wishing to be bound by a particular theory, the inventors have recognized that the splitter circuit in the exemplary embodiment described above effectively operates as a "reverse XOR gate," such that a logic high at the input corresponds to a logic high and a logic low at the two outputs, and a logic low at the input corresponds to both of the two outputs having the same polarity. It should be appreciated that in such a "reverse XOR gate," a truth table for the input and two outputs of the splitter circuit is the same as a truth table for an XOR gate, with the input of the splitter circuit corresponding to the XOR gate output in the truth table and the two outputs of the splitter circuit corresponding to the XOR gate inputs in the truth table. The inventors have recognized and appreciated a simple circuit design to implement such a "reverse XOR gate." In some embodiments, the reverse XOR gate design may be implemented with a small number of CMOS transistors. The CMOS-based delay line circuit design may provide a device having compact footprint and small electric power consumption.

The lower rate signals may be separately processed and then combined back to the full rate of the input signal in an XOR gate. In the example of a delay line, the processing of the lower-rate split signals may entail delaying each signal by a variable amount.

According to an aspect of the present application, individually adjustable delays may be applied to the two split signals, for example by using two parallel delay paths coupled to respective outputs of the splitter circuit. The two delay paths generate two respective delayed split signals, which may be combined in a combiner circuit. The combiner circuit is configured to combine information carried within the data edges in each of the delayed two lower data rate split signals to generate a delayed input signal that has the same amount and relative timing of data edges as the input signal, but with the variable delay. In some embodiments, an XOR gate may be used inside the combiner circuit with two inputs configured to receive the delayed split signals, and the output of the XOR gate configured to generate the delayed input signal.

According to another aspect of the present application, the amount of delay within individual parallel delay paths of the delay circuit may be offset by a calibration value to yield the amount of delay desired for the delayed input signal at the output of the combiner circuit, relative to the original input signal.

Figure 1:
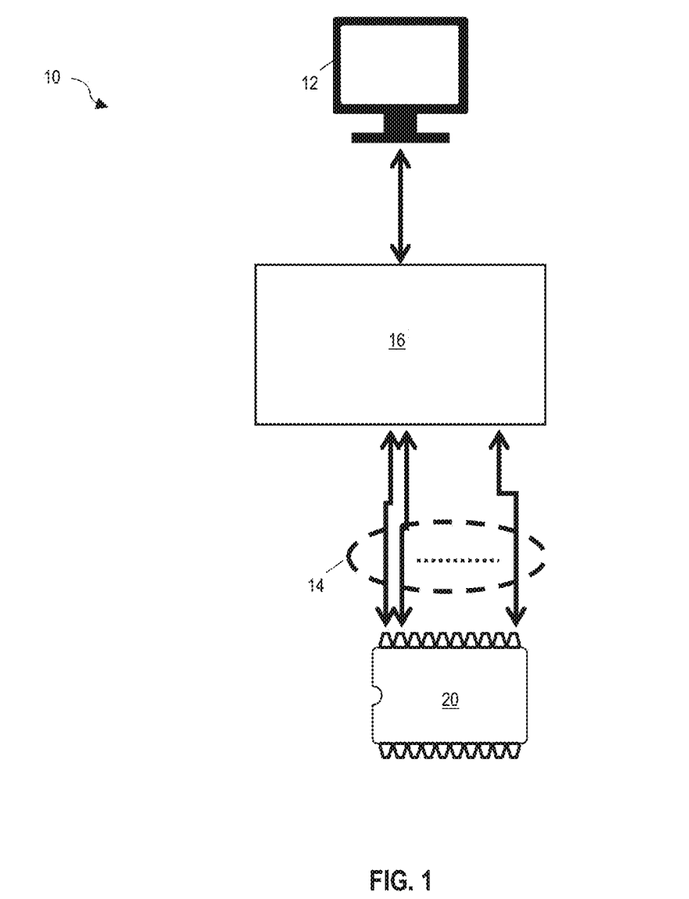
FIG. 1 is a schematic diagram of an exemplary embodiment of an automated test system in which a delay line architecture according to aspects of the present application may be applied, in accordance with some embodiments.

Referring to the figures, FIG. 1 is a schematic diagram of an exemplary embodiment of an automated test system in which a delay line architecture according to aspects of the present application may be applied. FIG. 1 illustrates a test system 10 that contains a test computer 12 that controls a tester 16 to perform tests on a device under test (DUT) 20 in accordance to methods disclosed in the present application. In some scenarios, the tester 16 may be an automated test equipment (ATE), constructed using techniques that are known in the art. The DUT 20 may be any suitable device for testing. For example, DUT 20 may be a semiconductor device. ATE 16 may contain circuitry to generate and/or measure multiple test signals 14 for DUT 20. ATE 16 may include multiple instruments configured to generate or measure different types of analog or digital signals. ATE 16 may include one or more timing generators configured to synchronize the generation of the multiple test signals within different channels. In some embodiments, ATE 16 may include a programmable delay line for delaying a signal, as described in detail below, for each of a plurality of timing signals that controls each of the plurality of test signals.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. Further, though FIG. 1 illustrates a scenario in which a single DUT 20 is being tested, test system 10 may be configured to test multiple devices. Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
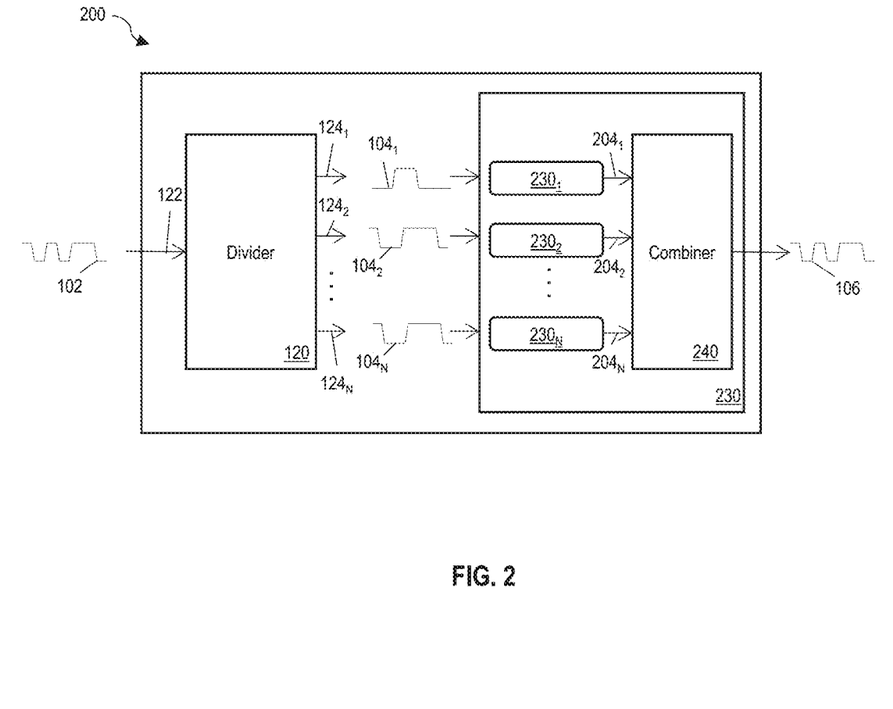
FIG. 2 is a schematic diagram illustrating a delay line circuitry for delaying a signal, according to some aspects of the present application.

FIG. 2 is a schematic diagram illustrating a delay line circuitry for delaying a signal, according to some aspects of the present application. As shown in FIG. 2, a delay line circuitry 200 is provided to receive an input signal 102 having a plurality of rising/falling edges and to generate a delayed signal 106 that is substantially the same as the input signal 102 with a programmable delay based on the parallel split signals. Delay line circuit 200 may be used in any desired location within a test system, including within the Pin Electronics. The input signal 102 may be a high frequency edge signal generated within a Timing Generator. As there may be multiple edges for each channel and multiple channels in a pin electronics chip, there may be multiple copies of the delay line circuit 200 in a pin electronics chip. Accordingly, implementing a delay line with compact, low cost and low power circuitry, such as CMOS, that can operate in the Gbps range may provide desirable qualities for a test system. A design as described herein enables such characteristics of a test system.

In the diagram shown in FIG. 2, splitter circuit 120 receives input signal 102 at an input 122, and generates N split signals $104_1$-$104_N$ at respective outputs $124_1$-$124_N$, where N is an integer. According to some embodiments, each of the split signals $104_1$-$104_N$ has a lower data rates than the data rate in input signal 102. A delay circuit 230 receives the split signals $104_1$-$104_N$, and generates a delayed signal 106 that is the input signal 102 with a delay. Delayed signal 106 has substantially the same data edges with substantially the same relative timing between data edges as input signal 102, but with each data edge's timing shifted by the predetermined delay.

According to an aspect of the present application, input signal 102 may be a digital data stream having a data rate of 5 Gbps, 20 Gbps, between 1 and 100 Gbps, or between 5 and 50 Gbps, although it should be appreciated that various aspects of the technology disclosed herein may be used with a digital data stream having any bandwidth. The delay line circuitry 200 is configured as a high speed delay line circuitry. As a specific example, the data rate may be 10 Gbps. Each of the N split signals $104_1$-$104_N$ has a respective data rate that is lower than the data rate of the input signal 102.

In some embodiments, the delay circuit 230 comprises N delay paths $230_1$-$230_N$ and a combiner circuit 240. Each of the delay paths $230_1$-$230_N$ receives a respective split signals $104_1$-$104_N$, applies an adjustable amount of delay, and generates a respective delayed split signals $204_1$-$204_N$. As above, the adjustable delay may include a programmable delay, such as may be applied by a timing generator based on programming in a pattern generator. That programmed delay may be offset by a calibration value that is determined as part of a calibration routine to compensate for variations in propagation delays of different signal paths within the test system. In some embodiments, each of the delay paths $230_1$-$230_N$ may separately delay rising and falling edges of the signals passing through it. Such a configuration enables accurate delays for circuitry that has asymmetric rise and fall times. Each of the delay paths $230_1$-$230_N$ may be implemented by a suitable technique known in the art to apply an adjustable amount of delay to a signal propagated therein.

The combiner 240 receives the N delayed split signals $204_1$-$204_N$, and generates the delayed signal 106 based on the N delayed split signals $204_1$-$204_N$.

According to an aspect, because split signals $104_1$-$104_N$ have lower data rate than input signal 102, low bandwidth components may be used in the delay circuit 230 and calibrated at a lower data rate than that of input signal 102. As a result, embodiments of the present application may provide high accuracy in delaying high speed signals. In one non-limiting example, for 10 Gbps input data, each of the delay path may see 5 Gbps data rates and the Trailing Edge Error (TEE) of the delay line may be less than 10 ps. Another advantage is a reduction of electric power consumption from using components operated at lower bandwidth than the data rate of the input signal.

A further advantage is modularity. Because the delay line comprises lower bandwidth components, in some embodiments a delay line that operate on high data rate input signals may comprise parallel modules that are delay lines in themselves but configured to operate on lower data rate input signals. For example, a 10 Gbps delay line may split the input signal into two half-rate split signals having 5 Gbps data rate, and comprise two parallel 5 Gbps sub-delay lines of any suitable design to delay the respective half-rate split signals, before combing the results into a delayed version of the 10 Gbps input signal. Such modularity may simplify circuit design for high speed delay lines.

Figure 3:
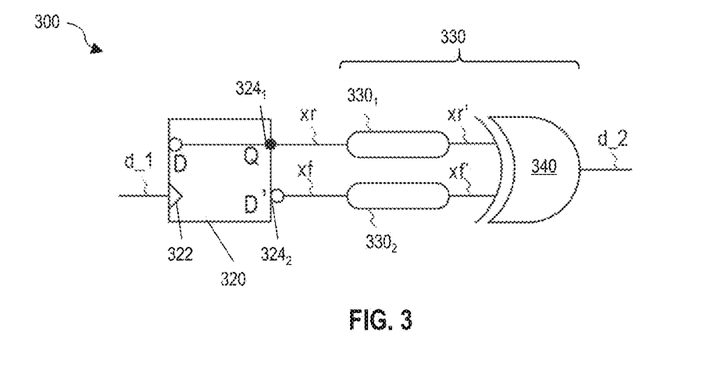
FIG. 3 is a schematic diagram illustrating an exemplary implementation of the delay line circuitry shown in FIG. 2 with two split signals and two delay paths, in accordance with some embodiments.

FIG. 3 is a schematic diagram illustrating an exemplary implementation of the delay line circuitry shown in FIG. 2 with two split signals and two delay paths, according to some embodiments. As shown in FIG. 3, a delay line circuitry 300 is provided to receive an input signal d_1 and to generate a delayed signal d_2 that is substantially the same as the input signal d_1 with a delay. Divider circuit 320 receives input signal d_1 at an input 322 and generates two split signals xr and xf at respective outputs $324_1$ and $324_2$. A delay circuit 330 comprises two delay paths $330_1$ and $330_2$ and an XOR gate 340. Each of the delay paths $330_1$ and $330_2$ receives a respective split signals xr and xf, applies an adjustable amount of delay and generates respective delayed split signals xr' and xf'. XOR gate 340 receives the two delayed split signals xr' and xf', and generates at the XOR gate output the delayed signal d_2 based on the delayed split signals xr' and xf'.

According to an aspect of the present application, input signal d_1 may be a digital data stream having a data rate of 5 Gbps, 10 Gbps, 20 Gbps, between 1 and 100 Gbps, or between 5 and 50 Gbps, although it should be appreciated that various aspects of the technology disclosed herein may be used with a digital data stream having any bandwidth. \ Each of the two split signals xr and xf has a respective data rate that is lower than the data rate of the input signal d_1. In some embodiments, xr and xf are half-rate signals having a data rate that is substantially half of the data rate in d_1. In one non-limiting example, d_1 has a data rate of 10 Gbps, while xr and xf have data rates of 5 Gbps.

In some embodiments, splitter circuit 320 is configured to operate as a "reverse XOR gate," such that a logic high at input 322 corresponds to one logic high and one logic low at the two outputs $324_1$ and $324_2$, and a logic low at the input 322 corresponds to both of the two outputs $324_1$ and $324_2$ having the same polarity. It should be appreciated that in such configuration, a truth table for the splitter circuit 320 between the two outputs $324_1$, $324_2$ and the single input 322 would map (00, 01, 10, 11) to (0, 1, 1, 0). As the input switches between 0 and 1, the two outputs change state, 1 bit at a time. For example, for each edge transition, splitter circuit 320 may progress through outputs states (xr, xf) in a repeating sequence of (0,0), (0,1), (1,1), (1,0), returning to (0,0) to repeat the pattern.

An exemplary implementation of a splitter circuit 320 and the relationship between signal waveforms at the input and outputs of the splitter circuit 320 will be discussed in detail below in relation to FIGS. 4 and 5.

Figure 4:
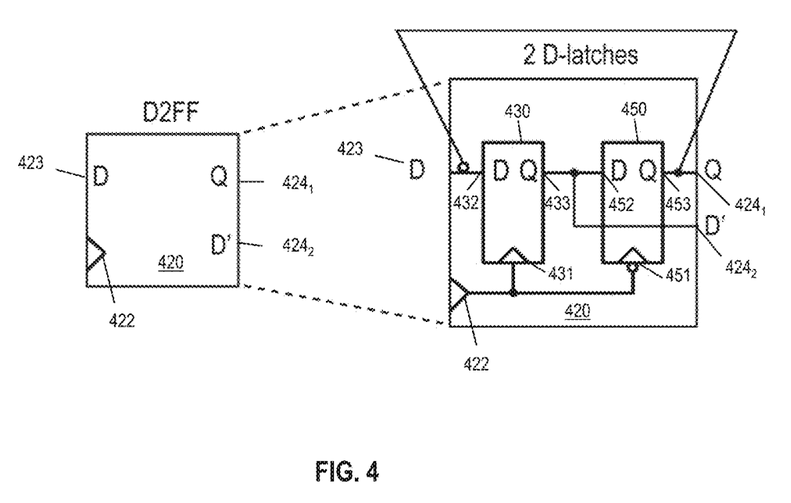
FIG. 4 is a schematic diagram illustrating an exemplary implementation of a splitter circuit employing two D-latches, according to some embodiments.

FIG. 4 is a schematic diagram illustrating an exemplary implementation of a splitter circuit employing two D-latches, according to some embodiments. As shown in FIG. 4, splitter circuit 420 has a input 422 and two outputs $424_1$ and $424_2$. Divider circuit 420 comprises two D-latches 430 and 450. A first D-latch 430 has a first clock input 431, a first latch D input 432 and an first latch Q output 433. A second D-latch 450 has a second clock input 451, a second latch D input 452 and a second latch Q output 453. The two D-latches 430 and 450 are serially connected, with second latch D input 452 coupled to the first latch Q output 433. The second latch Q output 453 is inverted and then coupled to the first latch D input 432. The two D-latches 430 and 450 are clocked out of phase, with the first clock input 431 coupled to the input 422, and the second clock input 451 configured to receive an inverted signal from input 422. Output $424_1$ is coupled to the second latch Q output 453, and $424_2$ is coupled to the first latch Q output 433.

Divider circuit 420 shown in FIG. 4 is a modified D Flip-Flop (DFF), referred to in the figure as D2FF. Input 422 is the clock of the D2FF, output 424 is the Q output of the D2FF, and with D input of the D2FF at 423. A DFF is a flip-flop composed of two edge-triggered D-latches that are clocked out of phase. On the rising edge of the clock, incoming data is latched in the first latch, while the second latch provides the same data to the output, i.e. starts to track its input data. On the falling edge of the clock, latched data from the first latch is latched into the second latch, while the first latch starts to track the incoming data. The output $424_1$ (Q) stays constant until the next rising clock edge, when the above sequence repeats in the DFF. Divider circuit 420 is a D2FF, with the output $424_1$ (Q) being inverted and connected to the first input 432 (D), and acts as a toggle flip-flop (TFF). When a TFF is clocked, the output Q is a divided-by-2 version of the clock. For a given clock pattern, two output Q patterns are possible depending on the initial state of the TFF nodes, with the two possible Q patterns being inverted from each other.

Transistor level circuits for D-latches and inverters are known in the art. Such components may be implemented relatively simply, including using CMOS transistors. A transistor-level schematic for a D-latch, for example may include on the order of 10 transistors. An inverter may be implemented with as few as two transistors. Optionally and for example in a differential circuitry, an inverter may be implemented by a swap of the positive and negative polarity wire, without using any transistors. Divider circuit 420 may thus be implemented with a total of 20-25 transistors, and may be simple to implement and consume low power.

Referring back to FIG. 3, when the splitter circuit 320 is implemented as the D2FF 420 clocked at 422 by input signal d_1, its output $424_1$ (Q) will contain half of the edges of the input signal d_1. According to some aspects, because splitter circuit 420 is a positive edge triggered DFF, any data edge (falling or rising) in signal xr at the output $324_1$ (Q) corresponds to a rising d_1 edge. In the meantime, output $324_2$ (D') is a falling clock (d_1) edge preview of the rising clock (d_1) edge in output $324_1$ (Q). It should be appreciated that signal xf at output $324_2$ (D') has edges (rising or falling) for any falling d_1 edge. Therefore d_1 is split into two half-rate signals xr and xf each having half the amount of data edges during the same period of time compared to d_1.

Still referring to FIG. 3, because data edges in signal xr correspond to rising d_1 edges only, while data edges in signal xf correspond to falling d_1 edges only, it should be appreciated that a rising (falling) xr edge only happens when xf is low (high). Therefore the split signals xr and xf, when delayed respectively in delay paths $330_1$ and $330_2$ to become delayed split signals xr' and xf', may be combined in an XOR gate 340 to generate delayed signal d_2, which is a delayed version of the original input signal d_1. Therefore, every input signal d_1 rising edge leads to edges in xr and in turn, xr' after spending a first amount of time in the delay path $330_1$, and in response, XOR gate 340 will produce for an xr' edge a rising output edge corresponding to the original rising edge in d_1. Similarly, every input signal d_1 falling edge leads to a falling output edge, after spending a second amount of time in the delay path $330_2$. In effect, the edges in delayed signal d_1 correspond to respective edges in input signal d_1. According to another aspect, the first amount and second amount of delay applied to xr and xf may be calibrated to adjust relative timing of the data edges in d_2 to match those in the input signal d_1, as discussed in more detail below in relation to FIGS. 6 and 7.

Figure 5:
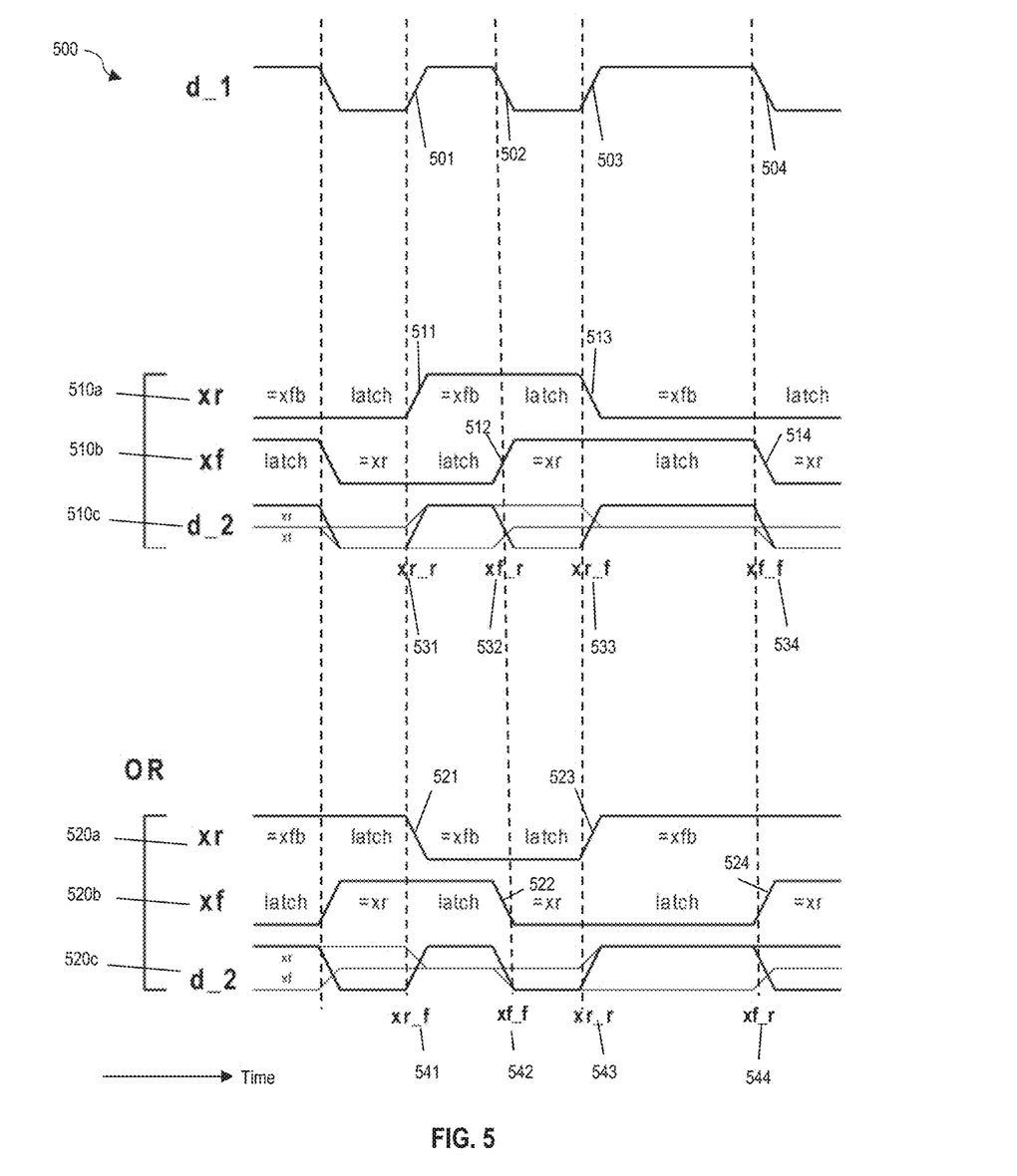
FIG. 5 illustrates a series of signal waveforms representing different operating states of the splitter circuit 420 shown in FIGS. 3 and 4, according to some embodiments.

FIG. 5 illustrates a series of signal waveforms representing different operating states of the splitter circuit 420 shown in FIGS. 3 and 4, according to some embodiments. Waveform 500 represents the timeline of an input signal d_1 received at input 422 to the splitter circuit 420. Waveforms 510a-510c represent timelines of two split signals xr and xf generated at outputs $424_1$ and $424_2$ of splitter circuit 420, and delayed signal d_2 at the output of XOR gate 340, in response to input signal d_1. Waveforms 520a-520c represent alternative timeline of split signals xr, xf and d_2, in response to input signal d_1. While data edges in waveforms 500, 510a-510c and 520a-520c appear aligned in time as illustrated in FIG. 5, it should be appreciated that such alignment is a simplification for illustration purpose only, and that data edges in split signals xr, xf and d_2 will be subject to propagation delays, and in the case of d_2, additional delay time added in the delay paths $330_1$ and $330_2$.

Depending on the initial state at xr and xf, D2FF 420 has two alternative startup modes in response to a data edge received from d_1 at input 422. As shown in FIG. 5, waveforms 510a-510c represent the first mode, where rising edge 501 in d_1 causes xr to flip from logic low to logic high with a rising edge 511, while rising edge 503 in d_1 causes falling edge 513 in xr. In the alternative mode shown in waveforms 520a-520c, rising edge 501 in d_1 causes xr to flip from a logic high to logic low with a falling edge 521, while rising edge 503 in d_1 causes rising edge 523 in xr. It should be appreciated that the two alternative waveforms for xr are inverted from each other, and that falling/rising edges in xr always correspond to rising edges in d_1. It should also be appreciated from waveforms 510a-510c and 520a-520c that xf remains at a constant logic level without any data edge in response to rising edges in d_1.

The other split signal xf flips in response to falling edges in input signal d_1. As shown in waveforms 510a-510c in FIG. 5, falling edge 502 in d_1 causes xf to flip from logic low to logic high with a rising edge 512, while falling edge 504 in d_1 causes falling edge 514 in xf. In the alternative mode shown in waveforms 520a-520c, falling edge 502 in d_1 causes xf to flip from a logic high to logic low with a falling edge 522, while rising edge 504 in d_1 causes rising edge 524 in xf. It should be appreciated that the two alternative waveforms for xf are inverted from each other, and that falling/rising edges in xf always correspond to falling edges in d_1. It should also be appreciated from waveforms 510a-510c and 520a-520c that xr remains at a constant logic level without any data edge in response to falling edges in d_1.

It should be appreciated that as shown in FIG. 5, d_1 is at logic high when only one of the xr and xf is at logic high, and that d_1 is at logic low when both of the two outputs are of the same polarity. It should be appreciated that a truth table for xr, xf and d_1 would map (00, 01, 10, 11) in xr, xf to (0, 1, 1, 0) in d_1, which is the truth table for an XOR gate. As a result, splitter circuit 420 may be considered a "reverse XOR gate."

It should also be appreciated that as shown in FIG. 5, each of xr and xf comprises half the number of data edges in a given time period compared to input signal d_1, and thus split signals xr and xf may be considered half-rate split signals. The separation between adjacent data edges is also longer in xr, xf compared to d_1. In some embodiments, data edges in input signal d_1 may be separated by a unit interval (UI) that is a duration of a data cycle. For example, in FIG. 5, edges 501 and 502 in d_1 are separated by one UI, while in each of the half-rate split signals xr and xf, separation between data edges never come closer than two original UIs.

Referring back to FIG. 3, the split signals xr and xf are separately delayed in respective delay paths $330_1$, $330_2$, before being combined in XOR gate 340 to generate at an output a delayed signal d_2. As shown in FIG. 5, in waveforms 510a-510c, output signal d_2 has rising edges 531 and 533 corresponding to the original rising edges 501 and 503. In particular, rising edge 531 is based on the rising edge 511 in xr, and may be referred to as xr_r, while rising edge 533 in d_2 is based on falling edge 513 in xr, and may be referred to as xr_f. Falling edge 532 in d_2 corresponds to falling edge 502 in d_1, and is referred to as xf_r as it is based on rising edge 512 of xf. Falling edge 534 in d_2 corresponds to falling edge 504 in d_1, and is referred to as xf_f as it is based on falling edge 514 of xf. Waveforms 520a-520c generally show correspondence between the data edges of d_2 and d_1, xr and xf in the alternative mode, and are not discussed in detail.

According to an aspect of the present application, an advantage of delaying a signal using techniques described herein is an improved rise/fall skew (RFS) range. RFS is the difference between rising and falling edge propagation delays. A circuit may be used to adjust relative delays between rising and falling edges in a signal in an operation referred to as rise/fall deskew (RFD). RFD may be used, for example, to modify a single pulse width within a signal stream. According to an aspect, each of delay paths $330_1$, $330_2$ in the delay line architecture 300 as shown in FIG. 3, may be used to perform RFD within themselves. For example and with reference to waveforms 510a-510c in FIG. 5, the first delay path $330_1$ may be used to perform RFD on xr by adjusting the rising/falling edges 511 and 513 within xr, while the second delay path 330₁ may perform RFD on xf to adjust rising/falling edges 512 and 514. Therefore because splitter circuit 320 doubles the number of data paths from one full-rate data path to two half-rate data paths, the two delay paths 330₁, 330₂ may provide adjustment of relative delay timing of four rising/falling edges xr_r, xr_f, xf_r and xf_f as shown in FIG. 5. As a result, the range of RFS control in a circuit such as the splitter circuit 320 is increased. For example, the circuit may perform rise/rise deskew (RRD) to adjust relative delay between even and odd rising edges of d_2, by adjusting delay timing of xr_r and xr_f using RFD in the first delay path 330₁ on xr. Similarly, a fall/fall deskew (FFD) may be performed on d_2 using RFD in the second delay path 330₂ on xf.

According to an embodiment, input signal d_1 is a 10 Gbps signal and the two split signals are half-rate 5 Gbps signals. A delay line according to aspects of the present application may have a RFD (e.g. xr_r or xr_f vs. xf_r or xf_f edge deskew) range of between −500 and 500 ps. The delay line may have a RRD (e.g. xr_r vs. xr_f edge deskew) range of between −200 and 200 ps. The delay line may have a FFD (e.g. xf_r vs. xf_f edge deskew) range of between −200 and 200 ps. As the xr line processes all the rising edges of the input signal and xf processes all the falling edges of the input signal, RFD range in particular is large, substantially from minus the xr delay line range to plus the xf delay line range, when pulse widening is counted as positive RFD.

One aspect of the present application is related to a method of calibration of the parallel delay paths within the delay line, such as delay line 300 as illustrated in FIG. 3. From FIG. 5 it should be appreciated that there may be two startup modes depending on the initial states of xr and xf upon initial power up or startup. It should be appreciated from FIG. 5 that no special measurement or "priming" is needed based on the initial startup modes of xr or xf, because regardless of the startup modes, any first d_1 edge received in the splitter circuit 420 will lead to an edge either on xr or xf in accordance to one of waveforms 510a-510c or 520a-520c, and the delay line will generate a delayed signal d_2 having the same edge from d_1. Even the first edge after startup is processed correctly.

According to an aspect, delay line 300 may be calibrated while considering its two startup modes. As shown in waveforms 510a-510c and 520a-520c in FIG. 5, the two startup modes swap the history of consecutive rising output edges, and similarly for the output falling edges. For example, in the first startup mode shown in waveforms 510a-510c, two consecutive rising edges 531, 533 in output signal d_2 corresponds to xr_r, followed by xr_f. Conversely, in the second startup mode shown in waveforms 520a-520c, consecutive rising edges 541, 543 in output signal d_2 corresponds to xr_f first, followed by xr_r. Edges xr_r and xr_f both contribute to rising edges in output signal d_2 but travel as rising or falling edges on the xr delay path 330₁. Thus, all four edges xr_r, xr_f, xf_r and xf_f need to be calibrated by adjusting the delay paths 330₁ and 330₂, such that the splitter circuit startup modes do not affect timing calibration of the resulting output signal d_2.

Figure 6:
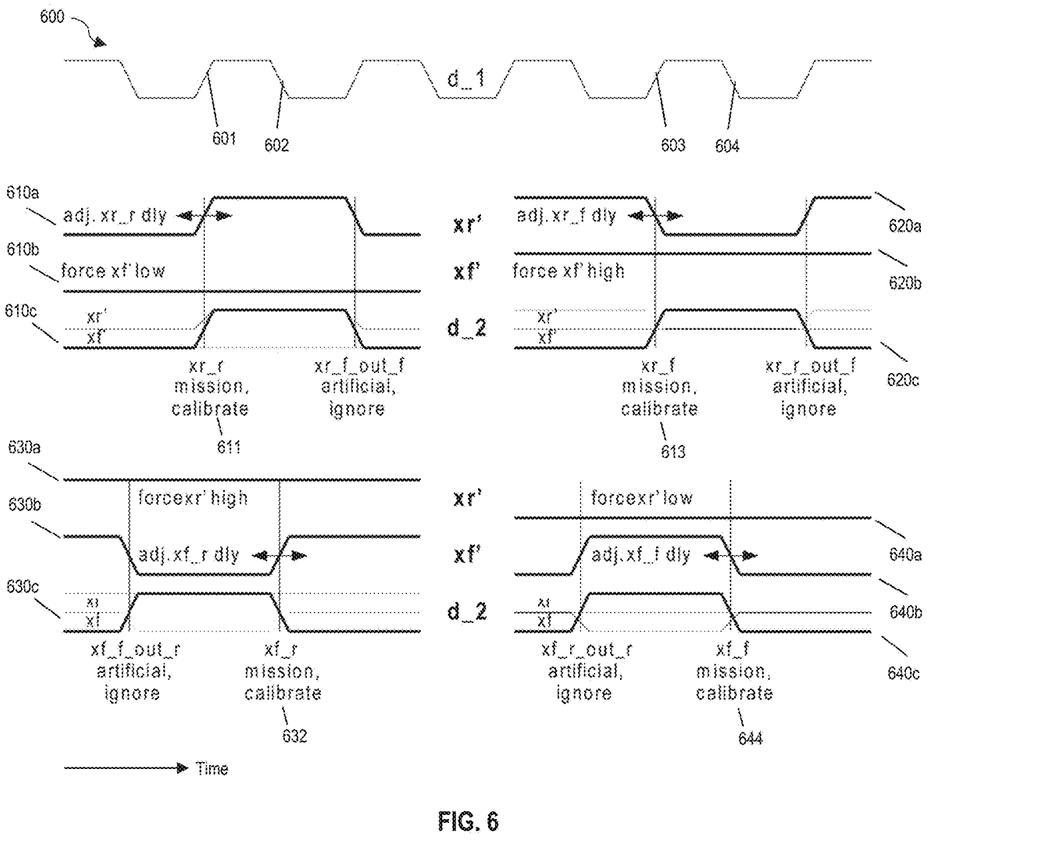
FIG. 6 illustrates a series of signal waveforms representing different operating states during a calibration method, according to some embodiments.

An exemplary method for calibrating each of the four edges xr_r, xr_f, xf_r and xf_f will now be discussed with reference to FIG. 6. FIG. 6 illustrates a series of signal waveforms representing different operating states during a calibration method, according to some embodiments. FIG. 6 shows a waveform 600 for input signal d_1 having rising/falling edges that toggle at a line data interval.

To calibrate xr_r and xr_f, adjustable delays directed to propagation of rising edge and falling edge in the first delay path 330₁ may be tuned, while monitoring the output delayed signal d_2. In some embodiments, the delayed split signal xf' may be set at a constant level, to allow calibration of xr. Waveforms 610a-610c show that when xf' is forced to be logic low, the combiner XOR gate 340 would combine a rising edge xr_r with xf' to generate a rising edge 611 in d_2. Therefore the measured rising edge 611 in d_2 represents a timing delay of rising edge xr_r based on the propagation of xr through first delay path 330₁. To calibrate rising edge xr_r, a rising edge propagation delay amount in the delay path 330₁ may be adjusted until the monitored rising edge 611 in d_2 is at a desired predetermined timing. Depending on the nature of delay path 330₁, any suitable method may be used to adjust its propagation delay amount for rising edges. In an example, a control signal may be sent to the delay path 330₁ to indicate a change in rising edge delay amount. The desired predetermined timing for rising edge 611 in d_2 may be a set amount of delay time compared to a known reference, such as the original rising edge 601, although it should be appreciated that any reference timing may be used to calibrate the desired timing for rising edge 611. In one example, the calibration may be relative, i.e. for each edge type such as xr_r, delay settings in the delay path may be adjusted such that the monitored d_2 edge is at a value relative to a reference delay line setting. The reference delay line setting may separately be calibrated by one or more external connections to the delay line circuitry, for example by connecting to external signal generators and oscilloscopes.

Other unique edge types in the delay line may similarly be calibrated using the method described above with respect to calibration of the rising edge xr_r in xr. As shown in waveforms 620a-620c in FIG. 6, by setting xf' to be at constant logic high, the splitter circuit 420 is forced to operate similarly to the alternative startup mode as shown in waveforms 520a-520c of FIG. 5. The measured rising edge 613 in d_2 represents a timing delay of falling edge xr_f based on the propagation of falling edges of xr through first delay path 330₁. To calibrate falling edge xr_f, a falling edge propagation delay amount in the delay path 330₁ may be adjusted until the monitored rising edge 613 in d_2 is at a desired predetermined timing.

Similarly, to calibrate falling and rising edge delays for propagation of xf in the second delay path 330₂, the delayed split signal xr' may be set at a constant logic high (for calibrating xf_r, see waveforms 630a-630c) or a constant logic low (for calibrating xf_r, see waveform 640a-640c). To calibration xf_r, a rising edge propagation delay amount in the delay path 330₂ may be adjusted until the monitored falling edge 632 in d_2 is at a desired predetermined timing. To calibration xf_f, a falling edge propagation delay amount in the delay path 330₂ may be adjusted until the monitored rising edge 644 in d_2 is at a desired predetermined timing.

Figure 7:
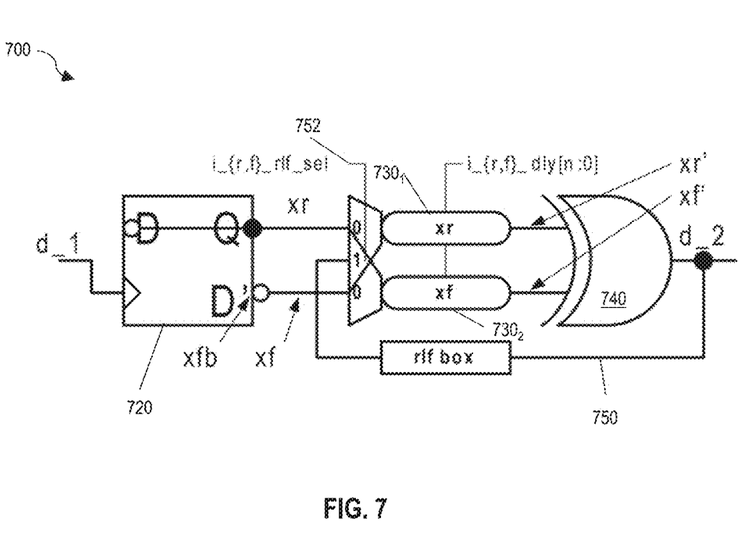
FIG. 7 is a schematic diagram of a delay line 700 having a feedback path for calibration, according to some embodiments.

According to an aspect of the present application, a full rate delay line can be calibrated by separately calibrating two half rate delay lines. FIG. 7 is a schematic diagram of a delay line 700 having a feedback path for calibration. In delay line 700, splitter circuit 720 receives a full rate input signal d_1 and generates two half-rate split signals xr and xf, which are delayed in two respective parallel delay paths 730₁ and 730₂. The delayed split signals xr' and xf' at output of the delay paths are combined in a combiner XOR gate 740 to generate a delayed signal d_2. A feedback path 750 couples the output of XOR gate 740 to the two delay paths 730₁ and 730₂ to monitor the output signal during calibration of the delay paths using for example the calibration method discussed above in relation with FIG. 6.

In some embodiments, feedback path 750 includes a ring loop frequency (RLF) box. The RLF box comprises a ring-oscillator circuit formed by closing an inverting loop around a number of delay elements. Changes in delay of a loop element would result in changes in frequency, allowing precise measurement of timing delays. An exemplary RLF implementation is described in detail in U.S. Pat. No. 9,147,620, the entirety of which is herein incorporated by reference. FIG. 7 shows that the half rate delay paths $730_1$, $730_2$ is coupled to the feedback path 750 to allow insertion of an RLF signal for calibrating the half rate delay paths. A control unit 752 is provided for inserting the RLF signal into both drv_dd x{r,f} sub line inputs to the respective delay paths $730_1$, $730_2$.

Having thus described several aspects of at least one embodiment of this invention, it is to be appreciated that various alterations, modifications, and improvements will readily occur to those skilled in the art.

For example, a splitter was illustrated by a two-way splitter. For an N-way splitter, the splitter may function similarly, distributing each rising and falling edge to a N parallel paths, with each application of a rising or falling edge to a path causing a state change within that path. An N-phase divider where N may be greater than two is known in the art and would be an exemplary generalization of the two-phase divider we have focused on in the description. It would function as an N-way "reverse-XOR", and at the line exit, signals may be combined with an N-way XOR circuit, also known in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An apparatus for delaying a signal, the apparatus comprising:
a splitter circuit comprising an input and N outputs, wherein N is at least two, and
the splitter circuit is configured to receive an input signal having a plurality of consecutive data edges with a first data rate at the input and to generate N split signals at the respective outputs, each of the N split signals having a data rate that is less than the first data rate; and
a delay circuit that comprises N adjustable delay paths, each delay path configured to receive a respective split signal and generate a delayed split signal, the delay circuit configured to generate a delayed signal based on the N delayed split signals, wherein the delayed signal comprises the plurality of consecutive data edges of the input signal with a delay, wherein:
the splitter circuit and the delay circuit are part of an integrated circuit, and
the delay circuit further comprises a combiner circuit configured to generate the delayed signal based on the N delayed split signals.

2. The apparatus of claim 1, wherein the delay circuit comprises an XOR gate.

3. The apparatus of claim 1, wherein N is two, and wherein each of the N split signals has a data rate that is half of the first data rate.

4. The apparatus of claim 1, wherein:
N is two,
the N outputs comprise a first output and a second output,
the splitter circuit is configured to generate a first split signal at the first output and a second split signal at the second output,
each of the input signal and the first and second split signals has a plurality of rising and falling edges,
the splitter circuit is configured to generate a first edge at the first output but not in the second output in response to a rising edge of the input signal, and
the splitter circuit is configured to generate a second edge at the second output but not in the first output in response to a falling edge of the input signal.

5. The apparatus of claim 1, wherein:
N is two such that the splitter circuit comprises two outputs, and
the splitter circuit is configured such that a logic high at the input corresponds to one logic high and one logic low at the two outputs, and a logic low at the input corresponds to both of the two outputs having the same polarity.

6. The apparatus of claim 1, wherein N is two, and the splitter circuit comprises:

a first D latch having a first clock input, a first latch input and a first latch output, wherein the input to the splitter circuit is coupled to the first clock input of the first D latch.

7. An apparatus for delaying a signal, the apparatus comprising:
a splitter circuit comprising an input, a first output, a second output, a first D latch having a first clock input, a first latch input and a first latch output, and a second D latch having a second clock input, a second latch input and a second latch output, wherein
the input to the splitter circuit is coupled to the first clock input of the first D latch,
the second D latch is configured to receive at the second clock input an inverted input signal,
the second latch input is coupled to the first latch output,
an inverted second latch output is coupled to the first latch input,
the first output is coupled to the second latch output, and
the second output is coupled to the first latch output, and wherein
the splitter circuit is configured to receive an input signal having a first data rate at the input and to generate two split signals at a respective output of the first and second outputs, each of the two split signals having a data rate that is less than the first data rate; and
a delay circuit configured to generate a delayed signal based on the two split signals, wherein the delayed signal is the input signal with a delay.

8. A method for delaying a signal using an apparatus comprising a splitter circuit and a delay circuit, the method comprising:
receiving, with the splitter circuit, an input signal having a plurality of consecutive rising and falling edges at a first data rate;
generating, with the splitter circuit, a first split signal having a plurality of rising and falling edges at a second data rate, and a second split signal having a plurality of rising and falling edges at a third data rate, wherein the second and third data rates are less than the first data rate;
generating, at the delay circuit, a delayed signal based on the first and second split signals, wherein the delayed signal comprises the plurality of consecutive rising and falling edges of the input signal with a delay, wherein
the splitter circuit comprises a first D latch having a first clock input, a first latch input and a first latch output,
generating the first and second split signals comprises:
receiving the input signal at an input of the splitter circuit;
coupling the input to a first clock input of the first D latch, and
the splitter circuit further comprises a second D latch having a second clock input, a second latch input and a second latch output, and
generating the first and second split signals further comprises:
coupling the second latch output to the first latch input of the first D latch;
coupling the second latch input to the first latch output of the first D latch;
receiving an inverted input signal at the second clock input;
generating the first split signal at the second latch output; and
generating the second split signal at the first latch output.

9. The method of claim 8, wherein the second and third data rates each is half of the first data rate.

10. The method of claim 8, wherein generating the first and second split signals comprises:
generating the first and second split signals such that a logic high at the input signal corresponds to a logic high and a logic low at the first and second split signals, and a logic low at the input signal corresponds to both of the first and second split signals being at the same polarity.

11. The method of claim 8, wherein generating the first and second split signals comprises:
generating a first edge in the first split signal but not in the second split signal in response to a rising edge of the input signal, and
generating a second edge in the second split signal but not in the first split signal in response to a falling edge of the input signal.

12. The method of claim 8, wherein generating the delayed signal comprises:
delaying the first and second split signals by a programmable amount; and
combining the first and second delayed split signals.

13. The method of claim 12, further comprising:
delaying the first split signal by a first amount;
delaying the second split signal by a second amount; and
wherein combining the first and second split signals comprises:
combining the delayed first and second split signals.

14. The method of claim 13, wherein the delay circuit comprises an XOR gate, and wherein combining the delayed first and second split signals comprises:
coupling the delayed first and second split signals to inputs of the XOR gate, and
generating the delayed signal at an output of the XOR gate.

15. A method for calibrating a test equipment comprising a splitter circuit configured to receive an input signal having a plurality of consecutive data edges with a first data rate, and to generate a first and a second split signals each having a data rate that is less than the first data rate; a first delay path configured to delay the first split signal by a first amount; a second delay path configured to delay the second split signal by a second amount; and a combiner circuit configured to receive the delayed first and second split signals at a first input and a second input, respectively, and to generate a delayed signal at an output based on the delayed first and second split signals, wherein the delayed signal comprises the plurality of consecutive data edges of the input signal with a delay, and the splitter circuit and the combiner circuit are part of an integrated circuit, the method comprising:
measuring the delayed signal at an output of the combiner circuit;
calibrating the first amount and the second amount based on the measured delayed signal.

16. The method of claim 15, wherein calibrating the first amount comprises:
setting a high or low signal level at the first input of the combiner circuit;
adjusting a parameter of the second delay path such that a data edge in the delayed signal has a predetermined timing.

17. The method of claim 15, wherein calibrating the first amount and the second amount comprises:
coupling the output of the combiner circuit to the first and second delay path via a feedback path.

* * * * *